(12) United States Patent
Sellmair

(10) Patent No.: US 8,242,674 B2
(45) Date of Patent: Aug. 14, 2012

(54) DEVICE FOR THE FIELD EMISSION OF PARTICLES AND PRODUCTION METHOD

(76) Inventor: Josef Sellmair, Freising (DE)

( * ) Notice: Subject to any disclaimer, the term of this patent is extended or adjusted under 35 U.S.C. 154(b) by 0 days.

(21) Appl. No.: 12/449,919

(22) PCT Filed: Feb. 28, 2008

(86) PCT No.: PCT/EP2008/001583
§ 371 (c)(1),
(2), (4) Date: Dec. 17, 2009

(87) PCT Pub. No.: WO2008/104393
PCT Pub. Date: Sep. 4, 2008

(65) Prior Publication Data
US 2010/0090579 A1    Apr. 15, 2010

(30) Foreign Application Priority Data

Mar. 1, 2007   (DE) .................. 10 2007 010 463

(51) Int. Cl.
H01J 1/50 (2006.01)
(52) U.S. Cl. ............... 313/160; 313/154; 313/309
(58) Field of Classification Search ............ 313/414, 313/441–460, 495–497, 293–304, 306, 309–310, 313/346, 351, 355, 153–162; 438/20; 250/310–311
See application file for complete search history.

(56) References Cited

U.S. PATENT DOCUMENTS

| | | | |
|---|---|---|---|
| 4,315,152 A * | 2/1982 | Smith | 250/396 ML |
| 5,041,732 A | 8/1991 | Saito et al. | |
| 5,789,858 A * | 8/1998 | Itoh et al. | 313/495 |
| 7,696,680 B2 * | 4/2010 | Wei et al. | 313/495 |
| 2003/0098410 A1 * | 5/2003 | Koga et al. | 250/236 |
| 2004/0026629 A1 * | 2/2004 | Fujieda et al. | 250/423 R |

(Continued)

FOREIGN PATENT DOCUMENTS

DE    10147132    5/2002

(Continued)

OTHER PUBLICATIONS

M. Troyon : High Current Efficiency Field Emission Gun Stream Incorporating a Preacceleration Magnetic Lens—Optik57, No. 2,(1980) pp. 401-419.

(Continued)

Primary Examiner — Mariceli Santiago
Assistant Examiner — Donald Raleigh
(74) Attorney, Agent, or Firm — Horst M. Kasper

(57) ABSTRACT

The invention relates to an apparatus and a method for production of a device for thermally induced field emission of particles for particle optical devices such as in particular electron or ion microscopes,
having at least one particle emitter (3) arranged in or pointing into a vacuum space (2) with at least one field emitter tip (4) for the emission of the particles,
and having a magnetic field generator (6) attributed to the particle emitter (3) for focussing of the emitted particle beam (5),
with the particle emitter (3) with its field emitter tip (4) is built by emitter structures (9) positioned on the surface (7) of a substrate (8) which is turned away from the magnetic field generator (6),
and the substrate (8) formed as separating wall between vacuum space (2) and the atmospheric space (10) situated outside the vacuum space (2) at the side (14) of the substrate (8) which is turned away from the emitter structures (9).

17 Claims, 4 Drawing Sheets

U.S. PATENT DOCUMENTS

Figure 1:
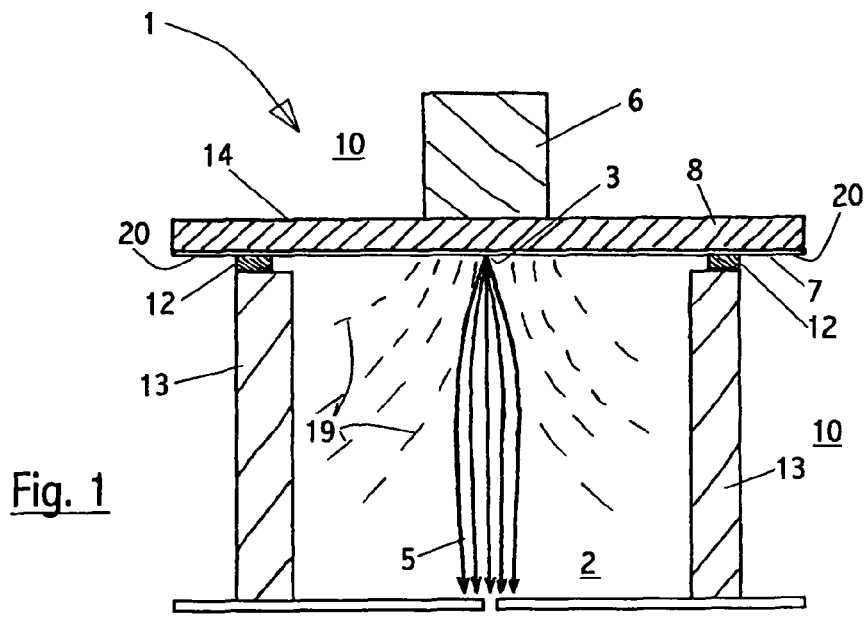

2004/0036402 A1* 2/2004 Keesmann et al. ............ 313/311
2006/0066200 A1* 3/2006 Moon ............................ 313/311
2008/0018228 A1* 1/2008 Choi et al. .................... 313/497

FOREIGN PATENT DOCUMENTS

| | | |
|---|---|---|
| DE | 19724606 | 5/2003 |
| EP | 1498930 | 1/2005 |
| WO | 2006/071861 | 7/2006 |

OTHER PUBLICATIONS

A., Delong : "A New Design of a Field Emission Gun with a Magnetic Lens"—Optik 81, No. 3 (1989), pp. 103-108.

Teo K.B.K. et al—"Cabron Nanotube Technology for Solid State and Valley Electronics"—IEE Proceedings Circuit, Devices and Seven IEE UK 151, No. 5.(2004) p. 1-9.

Niels De Jong Brightness of Carbon Nanotube Electron Sources Journal of Applied Physics 95, No. 2 (2004), pp. 673-681.

P.-Y. Chen et al Modeling of the Integrated Magnetic Focusing and Gated Field Emission Device with Single Carbon Nanotube—Journal B. 25, No. 1, 2007 pp. 1071-1523.

Kuo Hong-Shi et al. Preparation and Characterisation fo Single Atom Tips Nano Letters, 4, No. 12(2004), pp. 2379-2382.

\* cited by examiner

DEVICE FOR THE FIELD EMISSION OF PARTICLES AND PRODUCTION METHOD

The invention relates to a device for field emission of particles in particle optical apparatus and a method for production of such a device.

In particle optical apparatus, such as scanning electron microscopes for investigation of the surface structure or microprobes for material investigation by particle beam excitation, the diameter of the particle beam on the sample surface (probe current) in combination with the probe current intensity is a determining parameter for the resolving power of the apparatus. This combination is called probe current density. The probe current density and therefore the resolving power is in general limited in height by the chromatic aberration ("color aberration") and the spherical aberration (opening error) in particle optics. Further restrictions for the probe current density only plays a minor role in the applications considered. The energy spread of the particle current is causal for the chromatic aberration, the spatial extension of the particle beam for the spherical aberration in particle optics. The particle beam's spatial extension cannot be reduced too much without increasing the image recording time to impractical values due to signal noise during image recording. However, in particle beams having higher brightness, it can be smaller without loss of signal-to-noise ratio as compared to beams having smaller brightness. A high probe current density is being favoured by high brightness of the probe current. The minimum diameter of the particle beam at the sample surface at a fixed signal-to-noise ratio in modern apparatus is therefore limited by the brightness of the particle source on one hand, by the energy spread of the particle beam on the other hand. The energy spread of the probe current is essentially determined by the temperature and the material of the particle emitter. For smallest probe current diameters minimal energy spread is necessary. Usually, cold metals have the smallest energy spread of particle emission and for this reason the best conditions for high probe current density and high resolving power. The brightness of the probe current is limited by the brightness of the particle emitter, because brightness cannot be increased by particle optical components at given particle energy. However, particle optical components, if unproperly designed, reduce brightness. Therefore, for highest resolving power attention must be paid that all particle optical components are optimised.

Particle emitters for high resolution scanning electron microscopes have a sharp metal tip of one micrometer in diameter or less. This tip is unheated for smallest energy spread of the particle beam, or heated for easier particle emission from the emitter surface for higher emission current, depending on the embodiment. For the extraction of the particle beam all suchlike emitters have applied a high electrical field for stimulation of field emission. This field is inhomogeneous due to the small diameter of the emitter tip. Because of this it acts as an electrostatic immersion lens (an immersion lens is a lens having the object or the image in the field of the lens). This electrostatic immersion lens is an integral part of each suchlike emitter.

From particle optics it is known that magnetic lenses have superior particle optical characteristics compared to electrostatic lenses. As well it is known that immersion lenses have superior particle optical characteristics compared to conventional lenses. In specialist literature it is reported on attempts to equip particle emitters of particle microscopes with an additional magnetic immersion lens in order to improve the particle optical characteristics of the immersion lens (M. Troyon: "High current efficiency field emission gun system incorporating a preaccelerator magnetic lens. Its use in CTEM", OPTIK 57, no. 2 (1980), 401-419; A. Delong et al.: "A new design of a field emission gun with a magnetic lens", Optik 81, no. 3 (1989), 103-108; U.S. Pat. No. 5,041,732). This improvement was experimentally confirmed, too. However, the design of an additional magnetic immersion lens is complex and extensive due to demands on vacuum and space. For this reason there have been no particle emitters with integrated magnetic lens available as commercial product on the particle microscopy sector so far.

Figure 4:
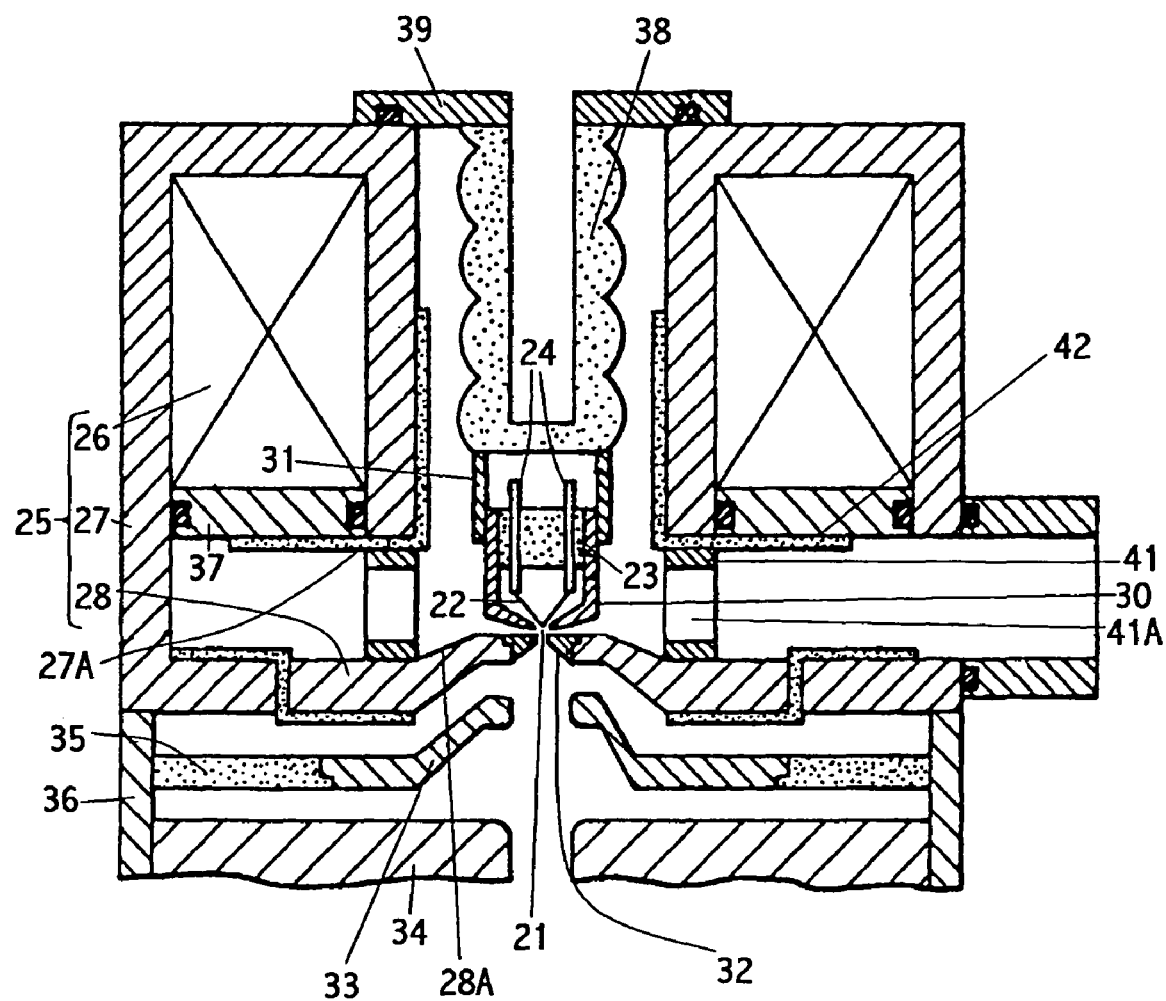

FIG. 4 shows the principal design of a particle source of a particle microscope, in particular of an electron microscope, comprising a magnetic lens such as it is known from U.S. Pat. No. 5,041,732. Such an electron microscope has a field emission tip 21 fixed to the end of a filament 22, where the filament 22 is attached to connection electrodes 24 which continue along an insulator 23. A magnetic lens 25 comprises a circular coil 26, a first magnet pole piece 27 incorporating the coil 26 and forming a magnetic path, and a second magnet pole piece 28 being electrically insulated but magnetically connected with the first magnet pole piece 27 to build a path for magnetic field lines. The inner diameter of the first magnet pole piece 27 is larger than the outer diameter of a holding plate 31 for a suppression electrode 30, with the emitter tip 21 and the suppression electrode 30 being placed within the magnetic lens 25. The magnetic field runs between a lower end surface 27A of the first magnet pole piece 27 and an upper end surface 28A of the second magnet pole piece 28. The emitter tip 21 is located at about the same height between both inner surfaces 27A and 28A. The inner diameter of the second magnet pole piece 28 is smaller than the inner diameter of the first magnet pole piece 27, in such a way that the maximum of magnetic flux density is positioned as close as possible to the emitter tip 21. The suppression electrode 30 is fixed to the insulator 23 in such a way that it surrounds the emitter tip 21, and is supported by the holding plate 31. An extraction electrode 32 having a narrow central borehole is located in the central part of the second magnet pole piece 28. A lens electrode 33 having a central borehole is located underneath the extraction electrode 32, and a ground electrode 34 having a central borehole is located underneath the lens electrode 33. The lens electrode 33 is firmed up on an outer wall 36 of a pillar by an insulator 35. The ground electrode 34 may be directly firmed up on the outer wall 36. The suppression electrode 30, the holding plate 31, the extraction electrode 32, the lens electrode 33, and the ground electrode 34 are all made of a nonmagnetic material such as titanium. The lower surface of coil 26 is covered by a vacuum sealing plate 37 made from nonmagnetic material like titanium for example. The holding plate 31 of the suppression electrode 30 is firmed up on an upper plate 39 by an insulator 38. Thereby the first magnet pole piece 27, the second magnet pole piece 28, the vacuum sealing plate 37, the insulator 38, and the upper plate 39 form a vacuum chamber. Hereby the vacuum chamber containing the emitter tip and the magnetic lenses, is mounted on the upper side of the outer wall 36 of the pillar. A supporting piece 41 made of a nonmagnetic material such as titanium is designed between the first and the second magnet pole piece in such a way that a deformation or a shift of the apparatus or parts of it caused by magnetic forces is avoided. The supporting piece 41 has openings 41A for vacuum evacuation. The supporting piece 41 is electrically insulated from the first magnet pole piece 27 by an insulator 42.

Figure 5:
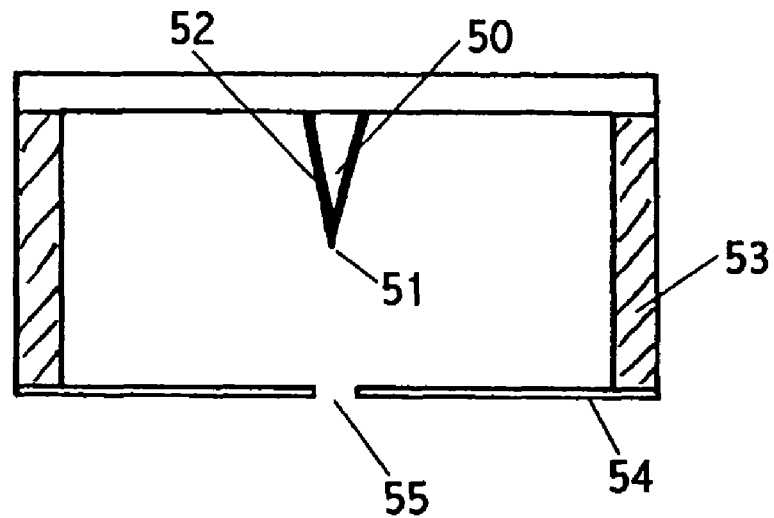
Figure 6:
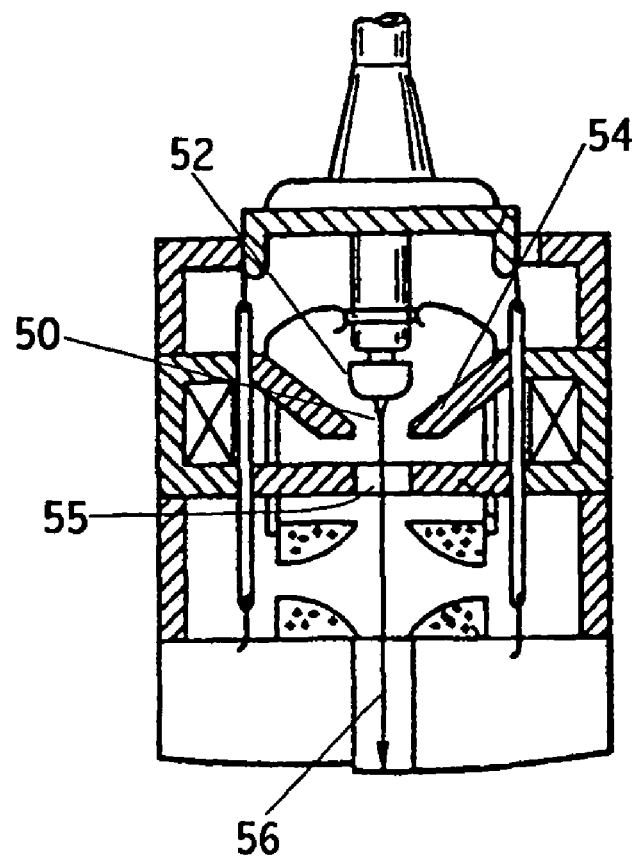

A principal sketch of the setup of a further particle beam head of prior art for a scanning particle microscope show FIGS. 5 and 6. A cold or heated field emitter 52, usually carried out as hairpin 50 having a sharp metal tip 51, is mounted above an insulator 53 opposite to a metal diaphragm 54 having an extraction opening 55 and lying at high negative or positive potential with respect to the diaphragm 54 which mostly is put at ground potential. Particles 56 are drawn out of the surface of the field emitter tip 51 by the high voltage difference applied between field emitter tip 51 and diaphragm 54, and are accelerated against the diaphragm 54. The opening of the diaphragm is usually very small because the following particle optics of the particle microscope can only make reasonable use of the central part of the particle beam 56 extracted from the field emitter 52. As a result of this, only a small fraction of the particle beam extracted is available for image acquisition.

The object of the invention is to provide an apparatus for (thermally induced or cold) field emission of particles for particle optical devices and a method of production which is constructively simpler and therefore cheaper in production.

According to the invention, an apparatus for field emission of particles for particle optical devices like electron or ion microscopes in particular is designed, having at least one field emitter arranged in or pointing into a vacuum space with at least one field emitter tip for the emission of particles, and having a magnetic field generator attributed to the particle emitter for bunching or focussing of the particle beam emitted, whereat the particle emitter with its emitter tip is built by electrically conductive structures positioned on the surface of a substrate which is turned away from the magnetic field generator, the substrate being electrically insulating at least at this surface, and the substrate serving as separating wall between vacuum space and the atmospheric space situated outside the vacuum space and the electrically conductive structures extending to the atmospheric space, and the magnetic field generator being arranged outside the vacuum space at the side of the substrate which is turned away from the emitter structures.

Following the principle of the invention the substrate is intended to carry several microstructures made from thin conductive layers and one or several field emitter tips, which together constitute the particle emitter, whereat the substrate is connected vacuum-tightly by insulators to a beam tube which is in particular electrically conductive and surrounding the vacuum space, and the magnetic field generator is placed outside the vacuum space.

In the sense of the invention it is advantageously intended that the emitter structures fabricated on resp. in the surface of the substrate have micromechanical dimensions and the field emitter tip has a radius of curvature smaller than 50 nm, and in particular smaller than 20 nm, preferably smaller than 10 nm, and furthermore smaller than 5 nm. According to the invention the substrate comprises a plurality of microstructures on its side facing the vacuum space, which are made of thin conductive layers and one or several field emitter tips together forming the particle emitter, with the substrate being vacuum-tightly connected to an in particular electrically conductive beam tube surrounding the vacuum space. Advantageously, the magnetic field generator as well as other instruments like coils and/or magnets are all placed outside the vacuum space.

With the apparatus according to the invention it is possible with minimal constructive effort to generate an action area of the magnetic field generator's magnetic field for bunching or focussing of the emitted particle beam which is smaller than about 10 mm, and preferably smaller than about 3 mm, and in particular preferably smaller than about 1 mm, whereupon the magnetic field generator advantageously generates a magnetic field which is in large parts essentially perpendicular to the surface of the extraction structures at the location of the field emitter tip.

The dimension and magnetic field strength of the magnetic field generator are preferably chosen such that the divergence of the particle beam after having left the magnetic field's action area is considerably reduced, respectively that the particle beam is made convergent. A divergently emitted electron beam becomes a parallel beam after about 0.2 mm at a magnetic field strength of 0.5 T and an electron beam energy of 100 eV.

The invention suggests an apparatus for field emission of particle beams using a magnetic immersion lens, in order to minimize the opening error of the particle optics. The apparatus for field emission has essential parts of dimensions on the micrometer scale or smaller and is produced by MEMS-technology (MEMS=micro electro mechanical system), which minimizes the necessary extension of the magnetic immersion field. This also allows the application of inexpensive magnetostatic or magnetodynamic units, and a simpler construction of this immersion lens. Due to the miniaturisation of the apparatus for field emission it is possible to place the magnetic field generator, which generates the magnetic immersion lens, outside the particle emitter vacuum, thus allowing a considerably less complex assembly of the apparatus.

According to the invention's principle the particle emitter consists of an embodiment of miniaturized type. The miniaturisation is carried out in such a way that the whole emitter structure lies on the surface of a flat substrate.

The thickness of the substrate is chosen so thin that the main part of the apparatus for the generation of the magnetic field can be attached to the side of the substrate facing the atmosphere, without reducing the magnetic field through the thickness of the substrate too much. The substrate can be carried out as border of the particle emitter vacuum. Thus it is possible to place the unit for magnetic field generation entirely outside the emitter vacuum. This considerably simplifies current supply, cooling, and adjustment of the magnetic field coils or permanent magnets. Likewise, due to the low substrate thickness and the miniaturisation, only a magnetic field of low spatial extension is necessary. This can be advantageously generated by small coils and/or small permanent magnets. Thus, at least a part of the magnetic field can be advantageously generated by a small permanent magnet. The necessary extraction voltage of miniaturised emitters typically is about 100 V and hence is considerably lower than those of usual particle emitters of about 5000 V. Therefore, also the energy of the particles in the volume region of interest is lower, and so is the immersion lens' magnetic field strength necessary for the focussing action, too. For example an initially divergent particle beam in a magnetic field of 0.5 T is parallel for the first time after a distance of 0.21 mm, at 5000 V this does not happen until 1.5 mm distance. The larger this distance, the larger is the lateral extension of the particle beam and also the opening error of the consecutive particle optics. This points up the benefits of low electron energies of miniaturised emitters for the reduction of opening errors of consecutive electron optical components.

However, it is also possible to generate ion beams at increased voltage and proper polarity with respect to the extraction electrode of the emitter potential (e.g. positive polarity for generation of positive ions). The field emission of ion beams requires considerably higher extraction voltage (e.g. typically 10 times higher) than the one needed for particle beams, and considerably higher magnetic fields of the magnetic lens, too. Generally, the field emission of higher ion currents also requires cooling of the field emitter, if the ions are transported from the gas phase to the field emitter tip. An advantageous cooling temperature for noble gases is usually below −100° C. (173 K), preferably below −200° C. (73 K). Thus the cooling temperature anyway necessary in the emitter area can be used for generating a strong magnetic field by superconduction.

The method according to the invention for production of a particle emitter for field emission of particles for particle optical apparatus like in particular electron or ion microscopes, having at least one field emitter arranged in or pointing into a vacuum area with at least one field emitter tip for the emission of particles, and having a magnetic field generator attributed to this particle emitter for bunching or focussing of the particle beam emitted, is characterised in that the particle emitter with its emitter tip is built by electrically conductive structures positioned on respectively in the surface of a substrate which is turned away from the magnet field generator, and the substrate serving as separating wall between the vacuum space and the atmospheric space situated outside the vacuum space, and the magnetic field generator being arranged outside the vacuum space at the side of the substrate which is turned away from the emitter structures.

In a preferred continuation of the method according to the invention it is envisioned that the thin conductive layers and the one or the multiple particle emitters together form the extraction structures, and that these are produced by particle lithographic methods. Herewith the particle emitter tip can be generated on an emitter conduction line by particle beam deposition in this connection.

A part of the thin conductive layers forms the extractor electrodes and/or other particle optical arrangements such as electrostatic focussing lenses and/or stigmators.

Advantageously a plurality of uniform emitters are built very close to each other on the substrate, including miniaturised focussing and/or detector arrangements.

In a continuation of the invention it can be envisioned that the miniaturised emitter tip is heatable, and a conduction line is formed on the substrate for the heating of the emitter tip by electrical current.

In another embodiment of the invention it can be envisioned that the substrate and/or the particle emitter is cooled by an external device. This has advantages in particular for the generation of ion beams from noble gas ions with the particle emitter.

The pressure of the atmospheric space situated outside the vacuum space can be reduced in relation to normal air pressure by technical means in order to permit lower thickness of the substrate and thus an increased inhomogenity of the magnetic field.

Preferred embodiments of the invention are given in the further depending claims.

Figure 2:
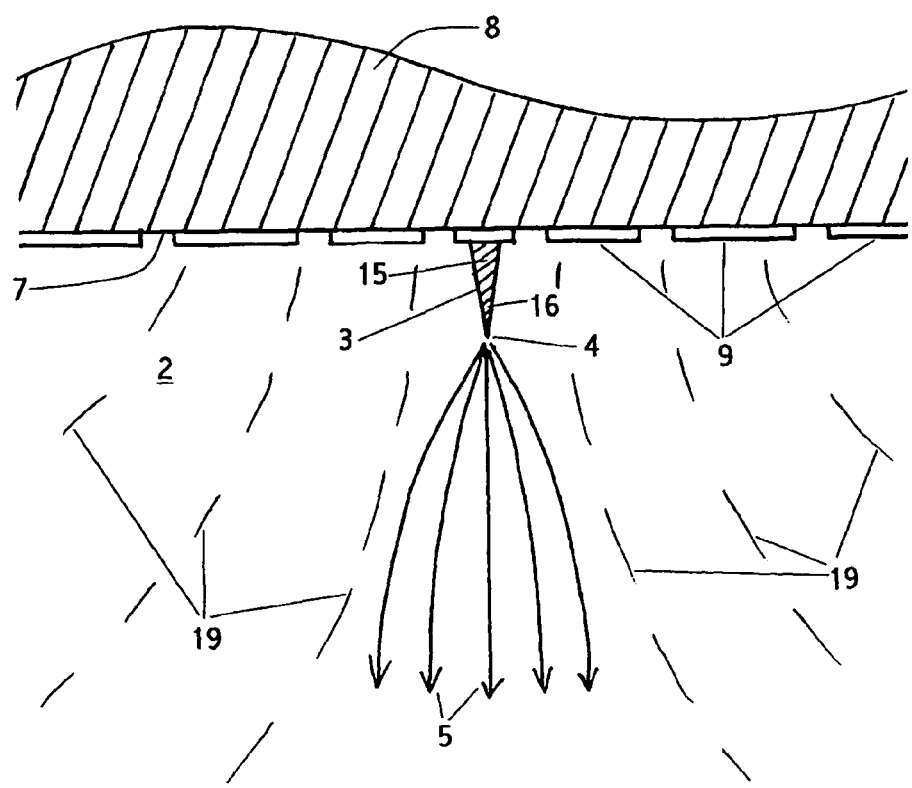
Figure 3:
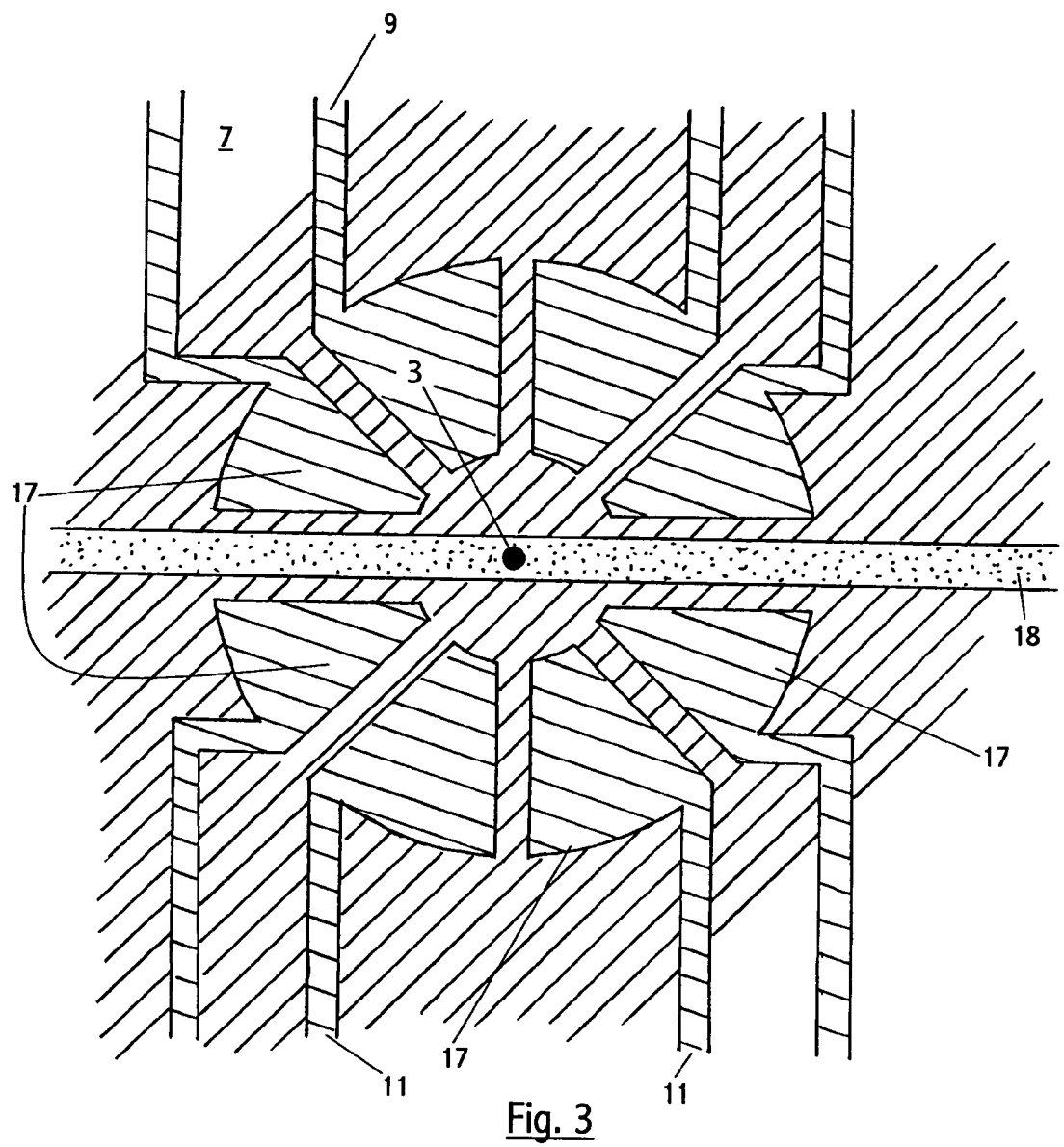

Additional advantages, characteristics, and utilities of the invention result from the consecutive description of embodiments on the basis of the drawing. It is shown in:

FIG. 1 a schematic sectional view of a preferred embodiment of the invention;

FIG. 2 an enlarged detail view of a detail from FIG. 1 of the preferred embodiment;

FIG. 3 a schematic top view of the preferred embodiment;

FIG. 4 a schematic sectional view of an electron beam source of prior art of a scanning electron microscope with integrated magnetic lens;

FIG. 5 a principal sketch of an electron beam head of prior art for a scanning electron microscope; and FIG. 6 a schematic sectional view of another electron beam source of prior art of a scanning electron microscope with integrated magnetic lens.

In FIG. 1 to FIG. 3 a preferred embodiment of an apparatus according to the invention for field emission of particles for particle optical devices like electron or ion microscopes in particular is presented. The apparatus 1 according to the invention comprises at least one particle emitter 3 arranged in, respectively pointing into the vacuum space 2 with at least one field emitter tip 4 for the emission of particles, in particular electrons, only schematically indicated by the arrows 5, and a magnetic field generator 6 attributed to the particle emitter 3 for bunching or focussing of the particle beam 5 emitted. According to the invention, the particle emitter 3 with its field emitter tip 4 is formed by emitter structures 9 built on, respectively in the surface 7 of the side of the substrate 8 which is turned away from the magnetic field generator 6. The substrate 8 is formed as a separating wall between the vacuum space 2 and the atmospheric space 10 situated outside the vacuum space 2, with the magnetic field generator 6 being arranged outside the vacuum space 2 at the side 14 of the substrate 8 which is turned away from the emitter structures 9. The emitter structures 9, fabricated on, respectively in the surface 7 of the substrate 8 have micromechanical dimensions, and the field emitter tip is built in such a way that the radius of curvature r of the field emitter tip 4 is lower than 50 nm, and in particular lower than 20 nm, preferably lower than 10 nm, and furthermore preferably lower than 5 nm. The magnetic field generated by the magnetic field generator 6 is indicated by the dashed lines 20. The action area of the magnetic field generated by the magnetic field generator 6 for the bunching or focussing of the emitted particle current 5 is smaller than about 10 mm, and preferably smaller than about 3 mm, and in particular preferably smaller than about 1 mm, with the magnetic field generator 6 generating a magnetic field which is to a big extent, at least at the location of the field emitter tip 4, essentially perpendicular to the surface of the extraction structures 9. The substrate 8 carries a plurality of structures 9, 11, 17, 18 of thin conducting layers on its side facing the vacuum space, and one or multiple field emitter tips 4 which together form the particle emitter 3. Here the substrate 8 is connected in a vacuum-tight manner by insulators 12 to a beam tube 13 which is in particular electrically conductive and surrounds the vacuum space, with the magnetic field generator 6 being arranged outside the vacuum space 2 and at the back side 14 of the substrate 8 turned away from the emitter structures 9. The dimensions of the magnetic field generator 6 are smaller than about 10 mm, and in particular smaller than about 3 mm. The virtual source size of the emitter 3 is smaller than 100 nm$^2$, and is in particular smaller than 25 nm$^2$, and preferably in particular smaller than 10 nm$^2$, and is furthermore in particular preferably smaller than 1 nm$^2$.

The field emitter tip 4 can be advantageously fabricated of at least two different materials, and can in particular have a base structure 15 of metal containing material and a layer structure 16 close to the surface having a larger carbon content or another material with preferred qualities, with these at least two different materials being deposited by electron beam deposition on the substrate 8 and/or vacuum evaporation or sputtering of the material onto the substrate 8. The emitter tip 4 can be made of paramagnetic material or of comparable material which increases the magnetic field strength at the location of the particle emission. The emitter tip 4 can alternatively be fabricated by ferromagnetic material or by a comparable material which increases the magnetic field strength at the location of the electron emission. The substrate 8 can be made of para-, ferro-, or permanent magnetic material, and in this case shows only a thin insulating layer on the substrate surface 7 with the emitter structures 9 arranged upon.

The apparatus for particle emission according to the invention has a brightness of more than 1000 A/(cm$^2$ sr V), and in particular more than 5000 A/(cm$^2$ sr V), and in particular more than 10000 A/(cm$^2$ sr V).

The conductive layers of the structures 9, 11, 17, 18 extend from the vacuum space 2 and the area occupied by the insulators 12 up to the side facing the surrounding atmosphere, where they form electrically conducting pads 20.

The magnetic field generator 6 generates a magnetic field which is at least to a big extent essentially perpendicular to the surface 7 of the extraction structures at the location of the field emitter tip 4.

The magnetic field generator 6 consists of a permanent magnet of few mm physical dimension, whereat the magnetic field generated by the magnetic field generator 6 does not extend significantly further than a few mm into the vacuum space 2, in order not to disturb the particle optical setup there. The magnetic field generator 6 can be mechanically adjusted by means of an adjustment unit (not shown in the figures). In a further preferred embodiment the magnetic field generator 6 consists of a permanent magnet and/or one or several coils. The coils preferably serve for fine alignment and positional adjustment of the magnetic field generated by the permanent magnet. The permanent magnet can be made for example out of properly formed and magnetised permanentmagnetic material (such as CoSm or NdFeB). In another preferred embodiment the magnetic field generator 6 consists of a coil made of superconducting material. This embodiment is particularly suited for generation of ion beams. The magnetic field generator which generates the magnetic immersion lens can be arranged outside the particle emitter vacuum space 2.

The thin conductive layers 9, 11, 17, 18 and the one or the multiple field emitter tips 4 together form the particle emitter 3, with these being made by particle beam lithographic methods. Particularly the particle emitter tip 4 is generated by particle beam deposition. A part of the thin conductive layers 9, 11, 17, 18 form particle optical arrangements like extraction and beam forming electrodes 17 (for example extraction electrodes, electrostatic focussing lenses, or stigmators).

The substrate 8 has a thickness of preferably 1 mm or more, in order to withstand the pressure difference between the atmospheric space 10 and the vacuum space 2. The thickness of the conductive layers of the microstructures 11 is preferably about 100 nm, and its width between 1 μm and several mm depending on the particle optical requirements, with the emitter tip 4 being about 1 μm high and less than 1 μm wide at the basis. Other conduction lines serve as extraction structures. Advantageously a plurality of uniform emitters 3 with miniaturised focussing components and/or other particle optical components can be arranged at close distance next to each other on the substrate 8.

In another preferred embodiment a plurality of suchlike emitters 3 having miniaturised focussing and detector arrangements are implemented at close distance next to each other. This permits a considerably faster and more cost effective investigation of large samples, for example in the semiconductor technology, than is possible using the hitherto existing large particle optical microscopes.

In a further preferred embodiment the miniaturised field emitter tip 4 is heated. This is preferably effected by heating the conduction line by electrical current, whereat the conduction line can be concurrently built for heating the emitter tip 4 by electrical current on the substrate 8 at the same time. Heating the field emitter tip 4 has positive effects on the stability of the emitted particle current 5. The advantage of the invention is also based upon the fact that the heating using a conduction line lying on the substrate 8 is considerably easier to produce than the hairpins 52 according to prior art. In spite of the larger temperature loss to the substrate 8 it is readily possible to generate temperatures above 1000° C. at the emitter tip 4 with the construction according to the invention.

LIST OF REFERENCE SIGNS

1 apparatus
2 vacuum space
3 particle emitter
4 field emitter tip
5 particle current
6 magnetic field generator
7 substrate surface
8 substrate
9 conductive layers
10 atmospheric space
11 microstructures
12 insulators
13 beam tube
14 back side
15 basis structure
16 layer structure
17 extraction- and beam forming electrodes
18 emitter conduction line
19 magnetic field lines
20 conductive pads for electrical contacting
r radius of curvature of emitter tip

The invention claimed is:

1. Apparatus for producing a beam of charged particles by field emission, comprising: a field emitter arranged in or pointing into a vacuum space and comprising at least one field emitter tip for an emission of particles, a magnetic field generator attributed to the particle emitter for bunching or focusing of the particle beam emitted, wherein the particle emitter with its emitter tip is built by electrically conductive structures positioned on the substrate surface turned away from the magnetic field generator, the substrate being electrically insulating at least at this surface, and the substrate serving as separating wall between said vacuum space and the atmospheric space situated outside the vacuum space, and the magnetic field generator being arranged outside the vacuum space at the side of the substrate turned away from the emitter structures side; wherein at least a part of conductive layers of said electrically conductive structures arranged on or in the surface of the substrate turned to the side of said magnetic field generator extending through an area including the vacuum space and the insulating substrates and to an area turned to atmosphere, wherein said conductive layers of said electrically conductive structures represent electrical conductive pads, wherein said magnetic field generator consists of a permanent magnet having small dimensions of at maximum some few mm, and the magnetic field generated by said magnetic field generator extends at maximum some few mm into said vacuum space.

2. The apparatus according to claim 1, wherein said emitter structures fabricated on or in the surface of the substrate have micromechanical dimensions, and the field emitter tip has a radius of curvature smaller than 50 nm.

3. The apparatus according to claim 1, wherein said apparatus is designed for a particle optical device like an electron or ion microscope.

4. The apparatus according to claim 1, wherein at least a part of the surface of the substrate turned to said electrically conductive structures is insulated electrically.

5. Apparatus for producing a beam of charged particles by field emission, comprising: a field emitter arranged in or pointing into a vacuum space and comprising at least one field emitter tip for an emission of particles, a magnetic field generator attributed to the particle emitter for bunching or focusing of the particle beam emitted, wherein the particle emitter with its emitter tip is built by electrically conductive structures positioned on the substrate surface turned away from the magnetic field generator, the substrate being electrically insulating at least at this surface, and the substrate serving as separating wall between said vacuum space and the atmospheric space situated outside the vacuum space, and the magnetic field generator being arranged outside the vacuum space at the side of the substrate turned away from the emitter structures side; wherein at least a part of conductive layers of said electrically conductive structures arranged on or in the surface of the substrate turned to the side of said magnetic field generator extending through an area including the vacuum space and the insulating substrates and to an area turned to atmosphere, wherein said conductive layers of said electrically conductive structures represent electrical conductive pads,
wherein the action area of said magnetic field generated for focusing said particle beam is smaller than about 10 mm, wherein said magnet field generator produces a magnetic field which at least for a large part around said emitter tip is substantially perpendicular with respect to the surface of said extraction structures,
wherein said emitter structures fabricated on or in the surface of the substrate have micromechanical dimensions, and the field emitter tip has a radius of curvature smaller than 50 nm.

6. Apparatus for producing a beam of charged particles by field emission, comprising: a field emitter arranged in or pointing into a vacuum space and comprising at least one field emitter tip for an emission of articles a magnetic field generator attributed to the particle emitter for bunching or focusing of the particle beam emitted, wherein the particle emitter with its emitter tip is built by electrically conductive structures positioned on the substrate surface turned away from the magnetic field generator, the substrate being electrically insulating at least at this surface, and the substrate serving as separating wall between said vacuum space and the atmospheric space situated outside the vacuum space, and the magnetic field generator being arranged outside the vacuum space at the side of the substrate turned away from the emitter structures side; wherein at least a part of conductive layers of said electrically conductive structures arranged on or in the surface of the substrate turned to the side of said magnetic field generator extending through an area including the vacuum space and the insulating substrates and to an area turned to atmosphere, wherein said conductive layers of said electrically conductive structures represent electrical conductive pads, wherein said magnetic field generator comprises a permanent magnet and one or more coils, wherein said coils serve for fine tuning and spatial orientation of the magnetic field.

7. The apparatus according to claim 6, wherein said magnetic field generator consists of a permanent magnet having small dimensions of at maximum some few mm, and the magnetic field generated by said magnetic field generator extends at maximum some few mm into said vacuum space.

8. Method for production of a particle emitter for field emission of particles having at least one field emitter arranged in or pointing into a vacuum space with at least one field emitter tip for the emission of particles, and having a magnetic field generator attributed to this particle emitter for bunching or focusing of the particle beam emitted, the method comprising the steps:
building the particle emitter with its emitter tip by electrically conductive structures positioned on or in the surface of a substrate turned away from the magnet field generator, and the substrate serving as separating wall between the vacuum space and the atmospheric space situated outside the vacuum space, and
arranging the magnetic field generator outside the vacuum space at the side of the substrate which is turned away from the emitter structures, wherein at least a part of conductive layers of said electrically conductive structures arranged on or in the surface of the substrate turned to the side of said magnetic field generator extend through an area including the vacuum space and the insulating means and to an area turned to the atmosphere, wherein said conductive layers of said electrically conductive structures represent electrical conductive pads, wherein the action area of said magnetic field generated for focusing said particle beam is smaller than about 10 mm, wherein said magnet field generator means produces a magnetic field which at least for a large part around said emitter tip is substantially perpendicular with respect to the surface of said extraction structures.

9. The method according to claim 8, wherein said emitter structures fabricated on or in the surface of the substrate have micromechanical dimensions, and the field emitter tip has a radius of curvature smaller than 50 nm.

10. The method according to claim 8, wherein said apparatus is designed for a particle optical device like an electron or ion microscope.

11. The method according to claim 8, wherein at least a part of the surface of the substrate turned to said electrically conductive structures is insulated electrically.

12. Method for production of a particle emitter for field emission of particles having at least one field emitter arranged in or pointing into a vacuum space with at least one field emitter tip for the emission of particles, and having a magnetic field generator attributed to this particle emitter for bunching or focusing of the particle beam emitted, the method comprising the steps:
building the particle emitter with its emitter tip by electrically conductive structures positioned on or in the surface of a substrate turned away from the magnet field generator, and the substrate serving as separating wall between the vacuum space and the atmospheric space situated outside the vacuum space, and
arranging the magnetic field generator outside the vacuum space at the side of the substrate which is turned away from the emitter structures, wherein at least a part of conductive layers of said electrically conductive structures arranged on or in the surface of the substrate turned to the side of said magnetic field generator extend through an area including the vacuum space and the insulating means and to an area turned to the atmosphere, wherein said conductive layers of said electrically conductive structures represent electrical conductive pads, wherein said magnetic field generator consists of a permanent magnet having small dimensions of at maximum some few mm, and the magnetic field generated by said magnetic field generator extends at maximum some few mm into said vacuum space.

13. The method according to claim 12, wherein the action area of said magnetic field generated for focusing said particle beam is smaller than about 10 mm, wherein said magnet field generator means produces a magnetic field which at least for a large part around said emitter tip is substantially perpendicular with respect to the surface of said extraction structures.

14. Method for production of a particle emitter for field emission of particles having at least one field emitter arranged in or pointing into a vacuum space with at least one field emitter tip for the emission of particles, and having a magnetic field generator attributed to this particle emitter for bunching or focusing of the particle beam emitted, the method comprising the steps:

building the particle emitter with its emitter tip by electrically conductive structures positioned on or in the surface of a substrate turned away from the magnet field generator, and the substrate serving as separating wall between the vacuum space and the atmospheric space situated outside the vacuum space, and arranging the magnetic field generator outside the vacuum space at the side of the substrate which is turned away from the emitter structures, wherein at least a part of conductive layers of said electrically conductive structures arranged on or in the surface of the substrate turned to the side of said magnetic field generator extend through an area including the vacuum space and the insulating means and to an area turned to the atmosphere, wherein said conductive layers of said electrically conductive structures represent electrical conductive pads, wherein said magnetic field generator comprises a permanent magnet and one or more coils, wherein said coils serve for fine tuning and spatial orientation of the magnetic field.

15. The apparatus according to claim 5, wherein the magnetic field generator is disposed immediately on the substrate and wherein the particle emitter is attached directly to the substrate;

wherein the substrate is connected vacuum-tightly by insulators to a beam tube, which is electrically conductive and surrounding the vacuum space, with the magnetic field generator being arranged outside the vacuum space, and at the back side of the substrate turned away from the emitter structures;

wherein the particle emitter with its emitter tip is built by electrically conductive structures positioned respectively on the surface of a substrate which surface is turned away from the magnetic field generator, and the substrate serving as separating wall between the vacuum space and the atmospheric space situated outside the vacuum space at the side of the substrate which is turned away from the emitter structures;

wherein the thin conductive layers and one or multiple particle emitters together form an extraction structure;

wherein the substrate carries a plurality of structures of thin conducting layers on its side facing the vacuum space and one or multiple field emitter tips which together form the particle emitter;

wherein the thin conductive layers extend from the vacuum space and the area occupied by the insulators up to the side facing the surrounding atmosphere, where they form electrically conducting pads.

16. The apparatus according to claim 5, wherein the magnetic field generator is disposed immediately on the substrate and wherein the particle emitter is attached directly to the substrate;

wherein the substrate is connected vacuum-tightly by insulators to a beam tube, which is electrically conductive and surrounding the vacuum space;

wherein the particle emitter with its emitter tip is built by electrically conductive structures positioned respectively on the surface of the substrate which surface is turned away from the magnetic field generator;

wherein the thin conductive layers and one or multiple particle emitters together form an extraction structure;

wherein the substrate carries a plurality of structures of thin conducting layers on its side facing the vacuum space and one or multiple field emitter tips which together form the particle emitter;

wherein the thin conductive layers extend from the vacuum space and the area occupied by the insulators up to the side facing the surrounding atmosphere, where they form electrically conducting pads.

17. Method for production of a particle emitter for field emission of particles having at least one field emitter arranged in or pointing into a vacuum space with at least one field emitter tip for the emission of particles, and having a magnetic field generator attributed to this particle emitter for bunching or focusing of the particle beam emitted, the method comprising the steps:

building the particle emitter with its emitter tip by electrically conductive structures positioned on or in the surface of a substrate turned away from the magnet field generator, and the substrate serving as separating wall between the vacuum space and the atmospheric space situated outside the vacuum space, and arranging the magnetic field generator outside the vacuum space at the side of the substrate which is turned away from the emitter structures, wherein at least a part of conductive layers of said electrically conductive structures arranged on or in the surface of the substrate turned to the side of said magnetic field generator extend through an area including the vacuum space and the insulating means and to an area turned to the atmosphere, wherein said conductive layers of said electrically conductive structures represent electrical conductive pads, further comprising generating an action area of the magnetic field of the magnetic field generator for focusing and bunching of the emitted particle beam, which particle beam is smaller than about 1 mm in diameter;

choosing the dimension and magnetic field strength of the magnetic field generator such that the divergence of the particle beam is considerably reduced respectively that the particle beam is made convergent;

miniaturizing the particle emitter in such a way that the whole emitter structure lies on the surface of a flat substrate;

rendering the thickness of the substrate so thin that a main part of the apparatus for the generation of the magnetic field can be attached to the side of the substrate facing the atmosphere.

* * * * *